United States Patent
Parris et al.

(10) Patent No.: US 8,339,882 B2
(45) Date of Patent: Dec. 25, 2012

(54) DUAL BIT LINE PRECHARGE ARCHITECTURE AND METHOD FOR LOW POWER DYNAMIC RANDOM ACCESS MEMORY (DRAM) INTEGRATED CIRCUIT DEVICES AND DEVICES INCORPORATING EMBEDDED DRAM

(75) Inventors: Michael C. Parris, Colorado Springs, CO (US); Kim C. Hardee, Colorado Springs, CO (US)

(73) Assignee: ProMOS Technologies Pte. Ltd., Singapore (SG)

( * ) Notice: Subject to any disclaimer, the term of this patent is extended or adjusted under 35 U.S.C. 154(b) by 200 days.

(21) Appl. No.: 12/834,696

(22) Filed: Jul. 12, 2010

(65) Prior Publication Data
US 2012/0008444 A1  Jan. 12, 2012

(51) Int. Cl.
*G11C 7/00* (2006.01)
(52) U.S. Cl. .................... 365/203; 365/202; 365/204
(58) Field of Classification Search .................. 365/203
See application file for complete search history.

(56) References Cited

U.S. PATENT DOCUMENTS

| | | | |
|---|---|---|---|
| 5,276,645 A * | 1/1994 | Tanaka et al. | 365/189.07 |
| 5,734,619 A * | 3/1998 | Numata et al. | 365/230.03 |
| 5,815,451 A * | 9/1998 | Tsuchida | 365/203 |
| 6,049,493 A * | 4/2000 | Kitamoto et al. | 365/203 |
| 6,519,195 B2 * | 2/2003 | Kanno et al. | 365/189.15 |
| 6,570,799 B1 | 5/2003 | Parris | |
| 6,707,738 B2 * | 3/2004 | Choi et al. | 365/203 |
| 6,788,590 B2 | 9/2004 | Parris et al. | |
| 6,829,185 B2 * | 12/2004 | Beer | 365/203 |
| 7,286,427 B2 * | 10/2007 | Perner | 365/207 |
| 7,477,558 B2 * | 1/2009 | Lee et al. | 365/203 |
| 2004/0001378 A1 * | 1/2004 | Madan et al. | 365/202 |
| 2004/0174726 A1 * | 9/2004 | Nakamura et al. | 365/30 |
| 2009/0154274 A1 * | 6/2009 | Abu-Rahma et al. | 365/203 |
| 2012/0008445 A1 * | 1/2012 | Parris et al. | 365/203 |

* cited by examiner

*Primary Examiner* — Son Mai
(74) *Attorney, Agent, or Firm* — William J. Kubida; Peter J. Meza; Hogan Lovells US LLP

(57) ABSTRACT

A dual bit line precharge architecture and method for low power DRAM which provides the low operating voltage of a non-half supply voltage (VCC/2) precharge with the low memory array current consumption and low memory array noise spike of VCC/2 precharge techniques. The architecture and technique of the present invention provides both reference voltage (VSS) precharged sub arrays and VCC precharged sub arrays on the same DRAM memory either with or without the novel charge sharing or charge recycling circuitry between these two different sub arrays as disclosed herein.

6 Claims, 7 Drawing Sheets

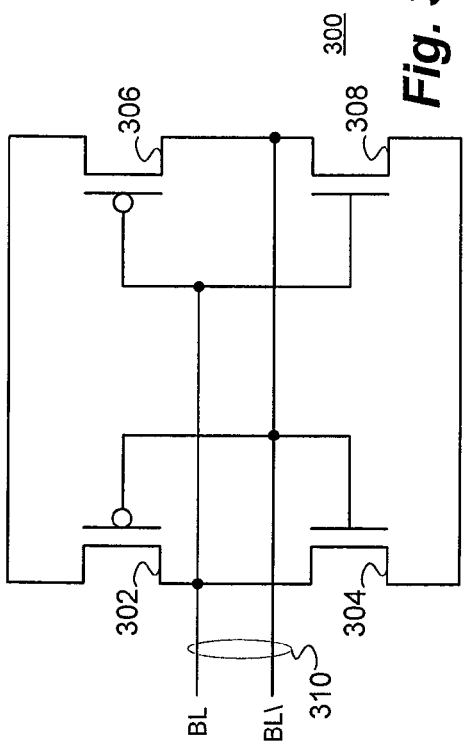
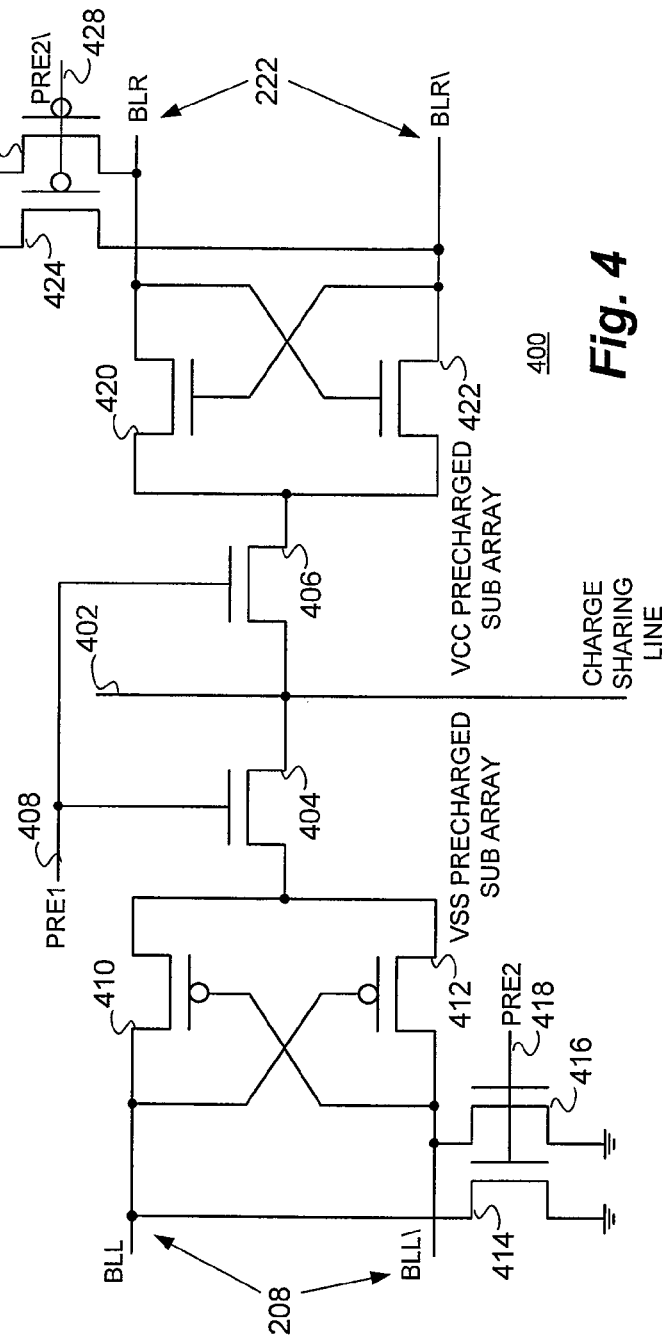

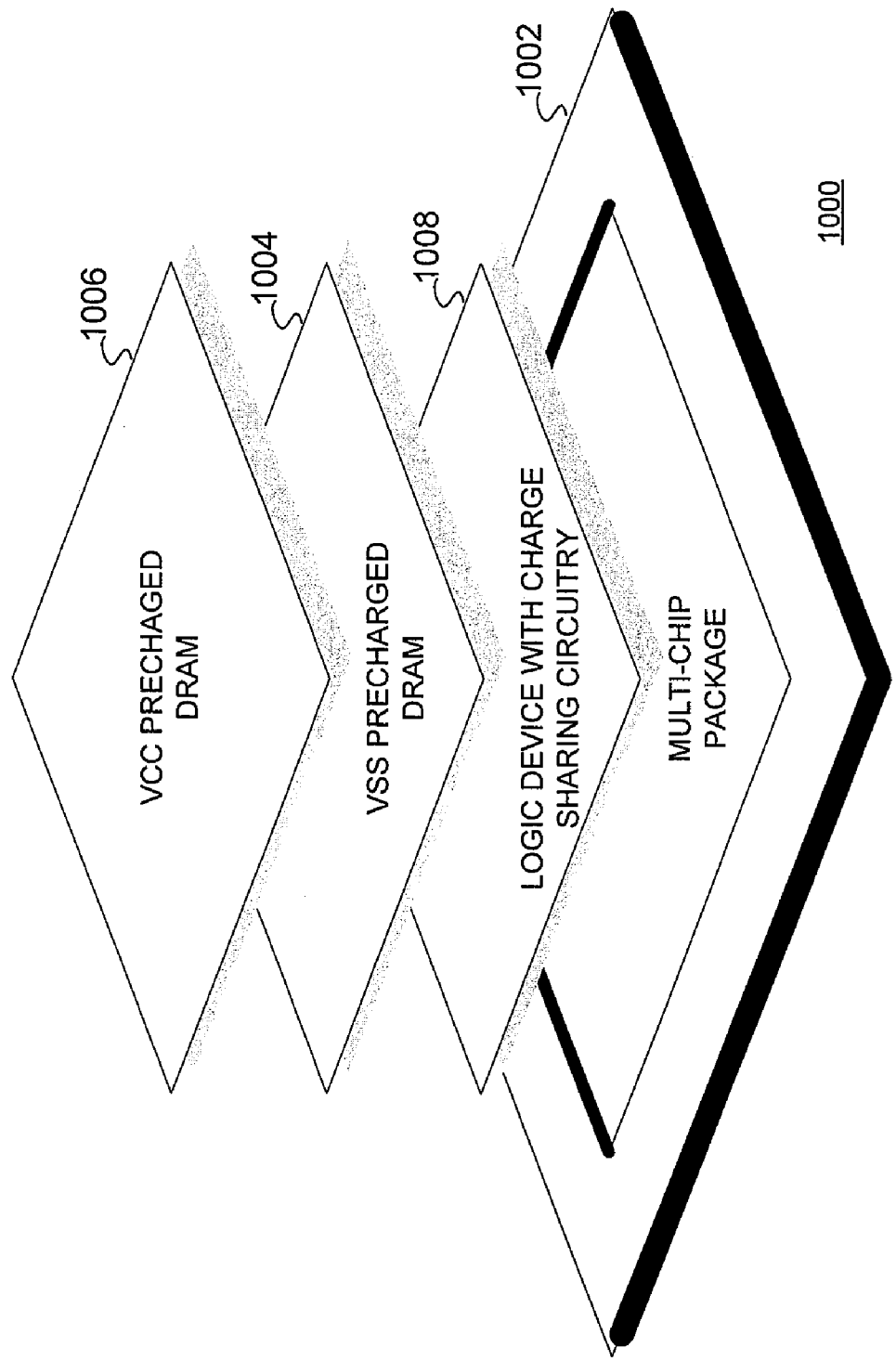

DUAL BIT LINE PRECHARGE ARCHITECTURE AND METHOD FOR LOW POWER DYNAMIC RANDOM ACCESS MEMORY (DRAM) INTEGRATED CIRCUIT DEVICES AND DEVICES INCORPORATING EMBEDDED DRAM

CROSS REFERENCE TO RELATED PATENT APPLICATIONS

The present invention is related to United States patent application Ser. No. 12/834,721 filed on even date herewith for DUAL BIT LINE PRECHARGE ARCHITECTURE AND METHOD FOR LOW POWER DYNAMIC RANDOM ACCESS MEMORY (DRAM) INTEGRATED CIRCUIT DEVICES AND DEVICES INCORPORATING EMBEDDED DRAM and assigned to ProMOS Technologies PTE.LTD., the disclosure of which is herein specifically incorporated by this reference.

BACKGROUND OF THE INVENTION

The present invention relates, in general, to the field of dynamic random access memory (DRAM) integrated circuit (IC) devices and devices incorporating embedded DRAM. More particularly, the present invention relates to a dual bit line precharge architecture and method for low power DRAM.

Lower power consumption is a major design goal for today's integrated circuit memories. Many applications for memory devices are mobile and the ability to provide extended battery life can be a key market advantage. Nevertheless, for applications not utilizing battery power, power consumption can also be important. Power consumption leading to heating problems can add extra expense to systems by way of requiring the use of cooling fans or larger heat sinks. High power consumption in memory circuits may also require the system to operate at reduced clock frequencies. Overall, the cooling and total energy costs of data centers or server farms required for large internet or database management companies needs to be reduced. The amount of power attributable to the DRAM in these applications is a significant portion of the total, usually more than 50% of the total power of the system.

By the nature of their operation, DRAM memory devices require a precharge function. This involves bringing all the bit lines in a sub array to a fixed voltage such as VCC (e.g. a supply voltage level; as used herein, the voltage level "VCC" is also intended to encompass VBLH [voltage bit line high] which is typically near VCC), VSS (e.g. a reference voltage level or circuit ground), or VCC/2 when the sub array is not "active". When both the bit line and the reference bit line (or bit line bar) are set to this precharge voltage, then the word line can go "active" allowing the charge from a selected memory cell to be placed on the bit line so that data can be sensed. Currently VCC/2 precharge is common in the industry for the bit line precharge voltage. This has the advantage of allowing low current consumption or low power operation due to the shorting together of bit lines as the sub array is entering precharge. Use of this shorting technique prevents current flow out of the VCC power supply and the precharge power is minimized. The non VCC/2 bit line precharge DRAM approaches do not have this power advantage and consume roughly double the memory array current or power as those utilizing VCC/2 precharge. There is also a di/dt (change in current per unit time) or power spike advantage for VCC/2 designs. For both the sensing portion and the precharging portion of the DRAM cycle, the power spike and related noise issues are approximately double for non-VCC/2 approaches.

However the voltage level of VCC is being reduced with each DRAM generation. Power supplies have been reduced from 3.3 v to 2.5 v, to 1.8 v to 1.5 v with each new Joint Electron Devices Engineering Counsel (JEDEC) standard, for example SDR (single data rate), DDR (double data rate), DDR2 (double data rate 2) and now DDR3 (double data rate 3) devices. This voltage reduction is also intended to save device operating power which is defined as:

$$\text{Power(watts)} = V(\text{volts}) \times I(\text{amps})$$

Since current is a function of the operating voltage, by lowering the supply voltage power is reduced by the lowered voltage squared. The problem for DRAMs is since transistor threshold voltages cannot be reduced beyond a certain point and remain fixed in the 600 mV range due to fundamental physics of silicon, these reduced VCC voltages when divided in half do not allow for normal operation of complementary metal oxide semiconductor (CMOS) memory array control circuits. In particular, the bit line sense amplifiers run out of operating margin and cannot function properly when the percentage level is near the transistor threshold voltage level. For this reason some future DRAM designs are investigating non-VCC/2 bit line precharge levels for these new lower voltage standards.

Generally, what is needed is a memory circuit architecture and technique with the low voltage operation of non VCC/2 precharge and the low memory array current consumption of VCC/2 precharge. Additionally, what is needed is a memory circuit design with the low voltage operation of non VCC/2 precharge and the low memory array noise spike of VCC/2 precharge.

SUMMARY OF THE INVENTION

By combining both VSS precharged sub arrays and VCC precharged sub arrays on the same DRAM memory with or without charge sharing or charge recycling circuitry between these two different sub arrays, the above problems can be addressed.

Power: The first embodiment of the present invention disclosed herein utilizes charge sharing techniques for non-VCC/2 precharge designs to reduce DRAM memory array power and therefore overall operating power. This solves the problems with previous non-VCC/2 bit line precharge approaches. The second embodiment of the present invention disclosed herein combines VSS and VCC precharged sub arrays on the same chip, which reduces current spikes and di/dt related noise effects.

Speed: Since in accordance with the present invention the peak memory array current is reduced, sensing and precharge control signals can be made faster with reduced concerns on internal voltage droop issues. This increases the overall speed of the DRAM.

Simplicity: The present invention may be conveniently implemented with existing CMOS circuit elements and any existing DRAM memory cell technologies.

Through the use of the present invention, results may be achieved of on the order of one half of the memory array power and or one half peak array power over that of prior art non VCC/2 bit line precharge designs. This represents a large portion of a DRAM's active power consumption, and even more importantly, it represents almost all of a DRAM's sleep mode power consumption.

The present invention can also be used with MCP (multi-chip package) or TSV (through silicon via) technologies where more than one DRAM exists in a single integrated circuit package. Here a grounded bit line precharge DRAM can charge share with a VCC bit line precharge DRAM in the same manner as described in FIGS. 1-6 with two different DRAM sub arrays.

Specifically disclosed herein is an integrated circuit device incorporating a random access memory array which comprises a first portion of the memory array capable of being precharged to a first voltage level and a second portion of the memory array capable of being precharged to a second differing voltage level substantially concurrently with the precharging of the first portion of said memory array. The device may also comprise a charge sharing circuit coupled to the first and second portions of said memory array.

Also disclosed herein is an integrated circuit device incorporating a random access memory array which comprises a first sense amplifier latch coupled to a first complementary bit line pair and a first latch node and a second sense amplifier latch coupled to a second complementary bit line pair and a second latch node. A first transistor couples the first sense amplifier latch to a supply voltage source and receives a first sense signal at a gate terminal thereof while a second transistor couples the second sense amplifier latch to a reference voltage source and receives a complement of the first sense signal at a gate terminal thereof. An additional transistor receives another sensing signal at a gate terminal for coupling the first and second latch nodes together wherein the another sensing signal is activatable prior to the first sense signal and the complement of the first sense signal.

Further disclosed herein is an integrated circuit device incorporating a random access memory array which comprises a first pair of cross-coupled transistors coupling a first pair of complementary bit lines to a first node and a second pair of cross-coupled transistors coupling a second pair of complementary bit lines to a second node. A first pair of common gate coupled transistors couple one of the first pair of complementary bit lines to a reference voltage level and receive a precharge signal at their common coupled gate terminals. A second pair of common gate coupled transistors couple one of the second pair of complementary bit lines to a supply voltage level and receive a complement of the precharge signal at their common coupled gate terminals. First and second additional transistors couple the first and second nodes respectively to a charge sharing line in response to an additional precharge signal at their common coupled gates, wherein the additional precharge signal is activatable following the precharge signal and the complement of said precharge signal.

Also further disclosed herein is an integrated circuit device incorporating a random access memory array which comprises a first sub array of the memory array capable of being precharged to a reference voltage level and a second sub array capable of being precharged to a supply voltage level.

Still further disclosed herein is a method for operating a random access memory array comprising first and second sub arrays. The method comprises precharging the first sub array to a reference voltage level and the second sub array to a supply voltage level. A first latch node of the first sub array is coupled to a second latch node of the second sub array. The first and second latch nodes are then uncoupled and data is sensed in the first and second sub arrays.

Additionally disclosed herein is a method for operating a random access memory array which comprises first and second sub arrays. The method comprises precharging the first sub array to a reference voltage level and the second sub array to a supply voltage level. The first and second sub arrays are coupled to a common charge sharing line and then uncoupled from the common charge sharing line.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 3 is a schematic illustration of a conventional sense amplifier (sense amp) latch;

FIG. 4 is a more detailed schematic illustration of a particular implementation of a portion of the novel charge sharing circuitry of FIG. 1 for use during a "precharge" operation;

FIG. 10 is another simplified perspective view of an embodiment of the present invention as shown in FIG. 1 fabricated as a multi-chip package device comprising one or more pairs of VSS and VCC precharged memory arrays in conjunction with a logic device incorporating charge sharing circuitry as disclosed herein.

DESCRIPTION OF A REPRESENTATIVE EMBODIMENT

Figure 1:
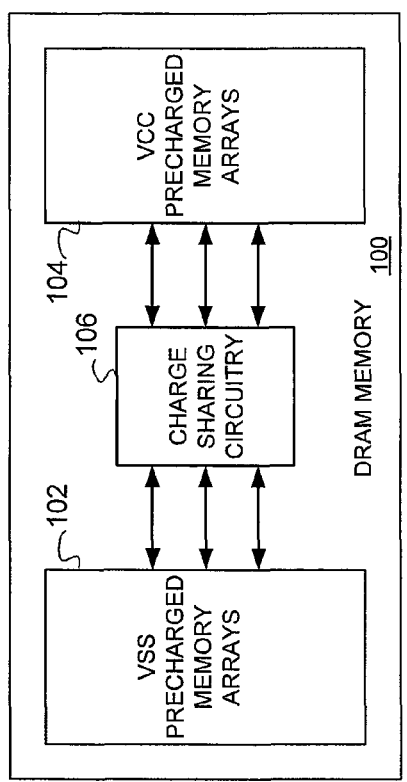
FIG. 1 is a representative block diagram of an integrated circuit device incorporating DRAM memory comprising both VSS and VCC precharged memory arrays in conjunction with associated charge sharing circuitry in accordance with a particular embodiment of the present invention.

With reference now to FIG. 1, a representative block diagram of an integrated circuit device incorporating DRAM memory 100 in accordance with a particular embodiment of the present invention is shown. The DRAM memory 100 may be embedded DRAM forming a portion of an integrated circuit (IC) device or a dedicated, commodity DRAM IC. As illustrated the DRAM memory 100 comprises both a VSS bit line precharged memory array 102 and a VCC bit line precharged memory array 104 in conjunction with associated charge sharing circuitry 106 as will be more fully described hereinafter. In this particular embodiment of the present invention, through the combination of both VSS precharged memory sub arrays 102 and VCC precharged memory sub arrays 104 on the same DRAM memory 100 in conjunction with a unique charge sharing circuitry 106, memory array power requirements can be reduced to half of that utilized in conventional VCC/2 precharged memories.

As disclosed herein, memory array 102 represents one or more memory arrays that have their bit lines precharged to VSS, a low voltage that will typically be held near ground, at a level above ground or at a level below ground such as an internal back bias voltage (VBB) or negative word line voltage (VNWL). In like manner, memory array 104 represents one or more memory arrays that have their bit lines precharged to VCC, a high voltage that is at some level above, below or substantially the same as an external supply voltage VCC. This high level bit line precharge may, for example, be an on-chip generated bit line high voltage (VBLH) or at some level boosted above VCC like VPP.

Figure 2:
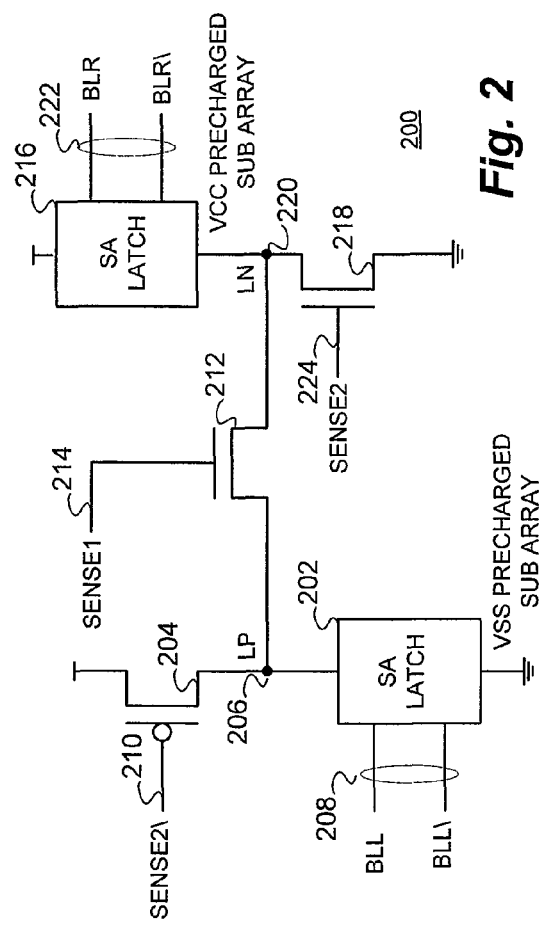
FIG. 2 is a more detailed schematic illustration of a particular implementation of a portion of the novel charge sharing circuitry of the preceding figure for use during an "active" operation.

With reference additionally now to FIG. 2, a more detailed schematic illustration of a particular implementation of a portion of the novel charge sharing circuitry 106 of the preceding figure is shown for use during an "active" operation as circuit 200. Circuit 200 comprises a sense amplifier (sense amp or SA) latch 202 for the VSS precharged sub array of the DRAM memory 100 (FIG. 1) which is coupled to the drain terminal of P-channel transistor 204 which has its source terminal coupled to a supply voltage level. The node intermediate the transistor 204 and the SA latch 202 is denominated as the latch P-channel, or LP node 206. The SA latch 202 is coupled to a left hand pair of complementary bit lines 208 labeled BLL and BLL\ (or BLL bar). The gate terminal of transistor 204 receives the complement of a SENSE2 signal, or SENSE2\ on line 210.

The LP node 206 is coupled to one terminal of N-channel transistor 212 which receives a SENSE1 signal at its gate terminal on line 214. The other terminal of transistor 212 is coupled to a latch N-channel, or LN node 220. An SA latch 216 is associated with the VCC precharged sub array of the DRAM memory 100 (FIG. 1) and is coupled to circuit ground (e.g. VSS) through N-channel transistor 218 which receives the SENSE2 signal at its gate terminal 224 as shown. The drain terminal of transistor 218 defines the LN node and the SA latch 216 is coupled to a right hand pair of complementary bit lines 222 labeled as BLR and BLR\.

The charge sharing circuit 200 incorporates transistor 212 in conjunction with the control signal SENSE1 on line 214. By having the SENSE1 signal go "active" and then "inactive" prior to the time the traditional sense amplifier clocks SENSE2 and SENSE2\ go "active", the existing charge from each sub array starts to move the LP and LN nodes 206, 220 and half the bit lines in each sub array in the direction required for sensing memory cell data. The resulting sense and restore behavior is shown in the t1 and t2 periods of the waveforms in FIG. 6. It should be noted that depending on device operating voltage levels and the transistor technology employed in a particular design, the SENSE1 signal may operate at a boosted level (i.e. greater than the supply voltage level such as VPP) however such is merely a matter of design choice. Time periods t1 and t2 comprise what is commonly referred to as the "active" portion of a memory circuit cycle and time periods t3 and t4 comprise what is also commonly referred to as the "precharge" portion of a memory circuit cycle.

With reference additionally now to FIG. 3, a schematic illustration of a conventional sense amplifier (sense amp) latch 300 is shown as may be utilized for the SA latches 202 and 216 of the preceding figure. The sense amplifier latch 300 comprises a pair of cross coupled complementary oxide semiconductor (CMOS) inverters comprising series connected P-channel transistor 302 and N-channel transistor 304 together with series connected P-channel transistor 306 and N-channel transistor 308 coupled across bit lines 310 BL and BL\. The source terminals of transistors 302 and 306 are referred to as LP. In the high precharged arrays they are tied to VCC or VBLH, a voltage near VCC. The source terminals of transistors 304 and 308 are referred to as LN. In the VSS precharged arrays they are tied to VSS or another voltage near circuit ground.

With reference additionally now to FIG. 4, a more detailed schematic illustration of a particular implementation of a portion of the novel charge sharing circuitry 106 of FIG. 1 is shown for use during a "precharge" operation as circuit 400. The circuit 400 comprises a charge sharing line 402 intermediate two series coupled N-channel transistors 404 and 406 having their gate terminals coupled to receive a PRE1 (precharge) signal on line 408. One terminal of transistor 404 is coupled to the common source terminals of cross-coupled P-channel transistors 410 and 412. The drain of transistor 410 and the gate terminal of transistor 412 are coupled to bit line BLL while the drain terminal of transistor 412 and the gate terminal of transistor 410 are coupled to the complementary bit line BLL\ of bit lines 208. An N-channel transistor 414 is coupled between bit line BLL and circuit ground while a corresponding N-channel transistor 416 is coupled between bit line BLL\ and circuit ground. A common PRE2 signal on line 418 is supplied to the gate terminals of both transistors 414 and 416.

In like manner, one terminal of transistor 406 is coupled to the common source terminals of cross-coupled N-channel transistors 420 and 422. The drain of transistor 420 and the gate terminal of transistor 422 are coupled to bit line BLR while the drain terminal of transistor 422 and the gate terminal of transistor 420 are coupled to the complementary bit line BLR\ of bit lines 222. A P-channel transistor 424 is coupled between bit line BLR\ and a supply voltage source while a corresponding P-channel transistor 426 is coupled between the supply voltage source and bit line BLR. A common PRE2\ signal on line 428 is supplied to the gate terminals of both transistors 424 and 426.

Figure 6:
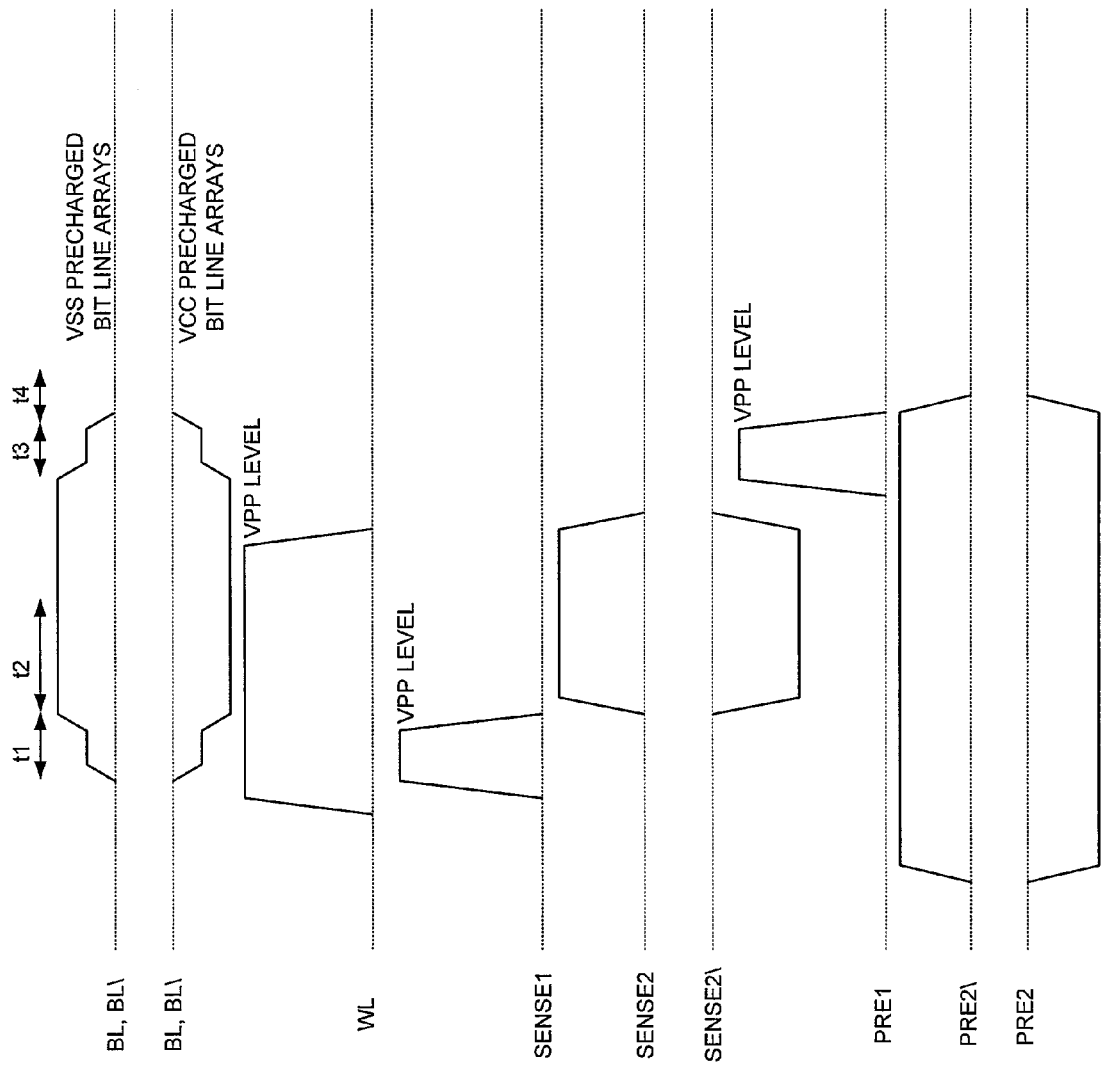
FIG. 6 is a series of signal timing diagrams illustrative of device operation in accordance with a particular embodiment of the present invention.

In operation, the circuit 400 illustrates that by adding transistors 412, 410, and 404 to a VSS precharged sub array and adding transistors 420, 422 and 406 to a VCC precharged sub array in conjunction with the additional precharge signal PRE1 on line 408 that the current required for precharging these sub arrays can be shared or recycled between the two sub arrays. During time period t3 as shown in FIG. 6, the PRE1 signal goes "active" causing the low bit lines in the VCC precharged sub array to come up since transistor 406 is turned "on". These bit lines will meet the high bit lines in the VSS precharged sub array that are coming down by transistor 404 also being turned "on". Cross-coupled transistors 420 and 422 prevent the bit lines in the VCC precharged sub array that are already at the VCC level from coming down and wasting power. Cross-coupled transistors 412 and 410 prevent the bit lines in the VSS precharged sub array from coming up and also wasting power. The result is that the bit lines that need to move towards their precharge level and the charge sharing line 402 will be around the level of VCC/2 and the movement so far requires no power. Depending on device voltage levels and the transistor technology employed, the PRE1 signal on line 408 may operate at a boosted voltage level such as VPP but this is not absolutely necessary. After these bit lines have reached a voltage level near VCC/2, the PRE1 signal is turned "off" and PRE2 and PRE2\ signals are turned "on". This sequence is also illustrated in FIG. 6 during time t4 where the bit lines continue to be precharged up to their desired levels.

While the additional transistors shown in the circuit 200 of FIG. 2 (e.g. transistor 212) and in the circuit 400 of FIG. 4 (e.g. transistors 412, 410, 420, 422, 406, and 404) may both be used together to obtain maximum power savings, each of the circuits 200 or 400 may be used individually. The circuit 200 approach of FIG. 2 or the circuit 400 approach of FIG. 4 may each be implemented independently to achieve some power savings only during the sense operation or the precharge operation respectively.

Figure 5:
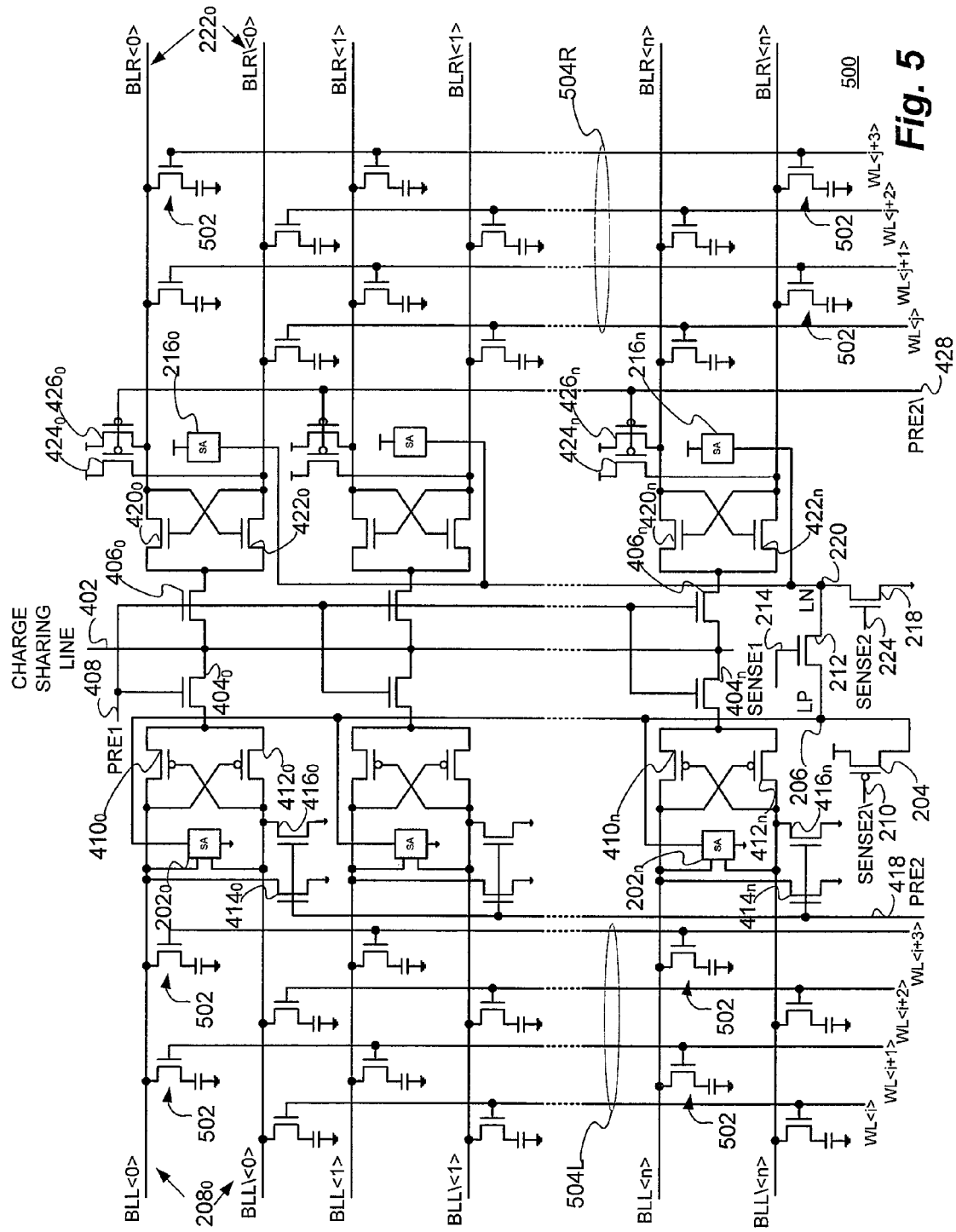
FIG. 5 is a DRAM memory comprising a further detailed illustration of two DRAM sub arrays incorporating the charge sharing circuit portions of FIGS. 2 and 4 in which both the VCC and VSS precharged sub arrays go active together.

With reference additionally now to FIG. 5, a DRAM memory 500 is shown comprising a further detailed illustration of two DRAM sub arrays incorporating the charge sharing circuit portions of FIGS. 2 and 4 in which both the VCC and VSS precharged sub arrays go "active" together. In this figure, like structure to that previously disclosed and described is like numbered and the foregoing description thereof shall suffice herefor.

The DRAM memory 500 comprises a number of memory cells 502 coupled to the BLL and BLL\ bit lines as well as the BLR and BLR\ bit lines. The memory cells 502 may conventionally comprise a pass transistor coupled to one of the complementary bit lines in series with a storage capacitor coupled to VSS or circuit ground. Each of the pass transistors of the memory cells has its gate terminal coupled to various word lines herein representatively labeled WL<1> through WL<i+3> and WL<j> through WL<j+3> as shown. In the exemplary DRAM memory 500 illustrated, n complementary bit line pairs are indicated as left hand bit lines BLL<0> and BLL\<0> through BLL<n> and BLL\<n> together with corresponding right hand bit lines BLR<0> and BLR\<0> through BLR<n> and BLR\<n>.

In the exemplary embodiment of the DRAM memory 500 shown, two DRAM sub arrays are illustrated with both the charge sharing circuits 200 (FIG. 2) and 400 (FIG. 4) included. Both sub arrays are configured to go "active" together, a VCC precharged sub array and a VSS precharged sub array. In operation, a word line in each sub array will go "active". It can be any random WL in each sub array, for example WL<i> in the left hand sub array can go "active" with WL<j+1> in the right hand sub array. Although it isn't a requirement for this invention, the word lines will typically go to a VPP or boosted level above VCC to restore a full VCC level back into the cells where a "1" data state has been stored. In a typical DRAM memory there may be many sub arrays going "active" at once, for example, sixteen. Utilizing the architecture and technique of the present invention eight of these sub arrays will be of the VCC precharged type and eight sub arrays will be of the VSS precharged type.

Figure 7:
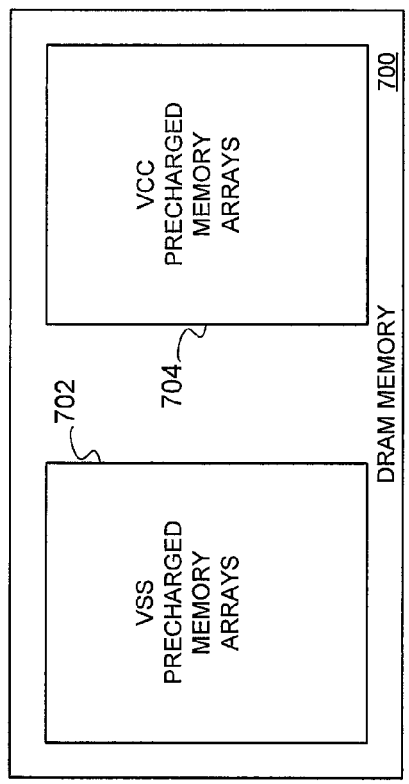
FIG. 7 is representative block diagram of an integrated circuit device incorporating DRAM memory comprising both VSS and VCC precharged memory arrays in accordance with another particular embodiment of the present invention.

With reference additionally now to FIG. 7, a representative block diagram of an integrated circuit device incorporating DRAM memory 700 is shown comprising both VSS and VCC precharged memory arrays in accordance with another particular embodiment of the present invention. The DRAM memory 700 of this alternative embodiment of the present invention comprises VSS precharged memory arrays 702 and VCC precharged memory arrays 704.

In this representative embodiment of the architecture and technique of the present invention, half the DRAM sub arrays are of the VSS bit line precharged type and half of the sub arrays are of the VCC bit line precharged type and no charge sharing circuitry is used. This will cut the change in current flow per unit time (di/dt), or peak power requirement, in half over a DRAM device with all the sub arrays being precharged to VCC or a DRAM with all the sub arrays being precharged to VSS. This is achieved with the DRAM memory 700 embodiment shown since during sensing, half the sub arrays are bringing bit lines to VCC while the other half of the sub arrays are bringing bit lines to VSS. Also during precharge, only half of the bit lines are moving in each direction.

This embodiment is attractive for multi-chip package (MCP) or through silicon via (TSV) applications where two or more DRAMs are placed in a single package with half the DRAMs utilizing VCC precharge and the other half utilizing VSS precharge to reduce overall system noise. Representative embodiments are illustrated and described hereinafter with respect to FIGS. 9 and 10.

Figure 8:
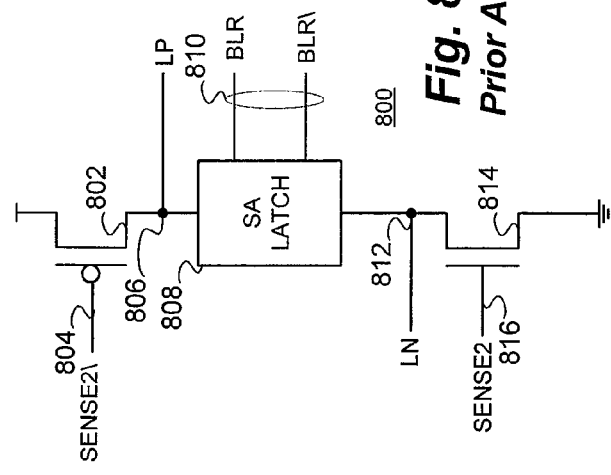
FIG. 8 is a schematic illustration of a conventional VCC/2 precharge circuit.

With reference to FIG. 8, a prior art schematic illustration of a conventional VCC/2 precharge circuit 800 is shown for comparison purposes only. The prior art circuit 800 comprises a P-channel transistor 802 which has its source terminal connected to VCC and its gate terminal connected to receive a SENSE2\ signal on line 804. The drain terminal of transistor 802 defines an LP node 806 and is connected to a sense amplifier latch 808 which is coupled to a pair of complementary bit lines 810, here designated as BLR and BLR\. The sense amplifier latch 808 is coupled to the drain terminal of an N-channel transistor 814 at LN node 812. The transistor 814 has its source terminal connected to VSS, or circuit ground, and receives a SENSE2 signal at its gate terminal on line 816.

Figure 9:
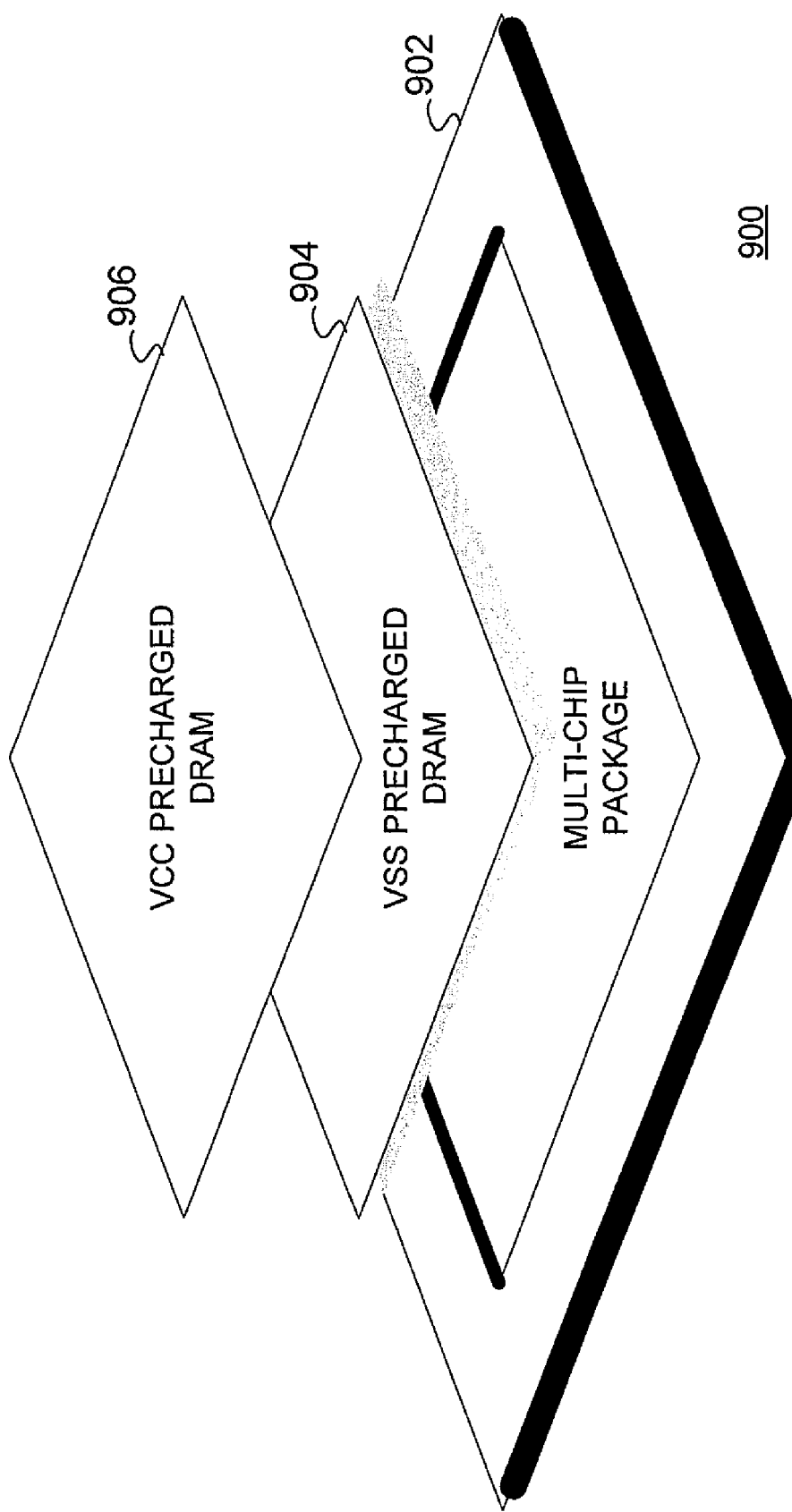
FIG. 9 is a simplified perspective view of an embodiment of the present invention as shown in FIG. 7 fabricated as a multi-chip package device comprising one or more pairs of VSS and VCC precharged memory arrays.

With reference additionally now to FIG. 9, a simplified perspective view of an embodiment of the present invention as shown in FIG. 7 is illustrated fabricated as a multi-chip package device 900 comprising one or more pairs of VSS and VCC precharged memory arrays 904, 906.

With reference additionally now to FIG. 10, another simplified perspective view of an embodiment of the present invention as shown in FIG. 1 is illustrated fabricated as a multi-chip package device 1000 comprising one or more pairs of VSS and VCC precharged memory arrays 1004, 1006 in conjunction with one or more logic devices 1008 incorporating charge sharing circuitry as disclosed herein. The logic device 1008 may comprise an Application Specific Integrated Circuit (ASIC), microprocessor (MPU) or other logic device which incorporates the charge sharing circuitry of FIG. 2 and/or FIG. 4. The multi-chip package devices 900 (FIG. 9) and 1000 may incorporate TSV, wire bonded, solder microbump or other technology to connect the various chips together within the device package.

Both embodiments of the present invention disclosed and described (FIGS. 1 and 7) can be used with shared or non-shared sense amplifier DRAM designs, open bit line or folded bit line DRAM designs. The architecture and technique of the present invention is also applicable to any DRAM memory cell type, for example, stacked capacitor, trench capacitor, 8F2, 6F2 . . . 35F2 type memory cells. It can also be used for ferroelectric random access memories (FRAM) and magnetic random memories (MRAM) where bit line precharge is also required.

While there have been described above the principles of the present invention in conjunction with specific circuitry, it is to be clearly understood that the foregoing description is made only by way of example and not as a limitation to the scope of the invention. It should also be noted that the principles of the present invention are equally applicable to DRAM arrays as well as DRAM sub arrays. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

As used herein, the terms "comprises", "comprising", or any other variation thereof, are intended to cover a non-exclusive inclusion, such that a process, method, article, or apparatus that comprises a recitation of certain elements does not necessarily include only those elements but may include other elements not expressly recited or inherent to such process, method, article or apparatus. None of the description in the present application should be read as implying that any particular element, step, or function is an essential element which must be included in the claim scope and THE SCOPE OF THE PATENTED SUBJECT MATTER IS DEFINED ONLY BY THE CLAIMS AS ALLOWED. Moreover, none of the appended claims are intended to invoke paragraph six of 35 U.S.C. Sect. 112 unless the exact phrase "means for" is employed and is followed by a participle.

What is claimed is:

1. An integrated circuit device incorporating a random access memory array comprising:
   a first pair of cross-coupled transistors coupling a first pair of complementary bit lines to a first node;
   a second pair of cross-coupled transistors coupling a second pair of complementary bit lines to a second node;
   a first pair of common gate coupled transistors, each coupling one of said first pair of complementary bit lines to a reference voltage level and receiving a precharge signal at said common coupled gates thereof;
   a second pair of common gate coupled transistors, each coupling one of said second pair of complementary bit lines to a supply voltage level and receiving a complement of said precharge signal at said common coupled gates thereof; and
   first and second additional transistors for coupling said first and second nodes respectively to a charge sharing line in response to an additional precharge signal at their common coupled gates thereof, wherein said additional precharge signal is activatable prior to said precharge signal and said complement of said precharge signal.

2. The integrated circuit device of claim 1 wherein said first pair of cross-coupled transistors are P-channel devices and said second pair of cross-coupled transistors are N-channel devices.

3. The integrated circuit device of claim 1 wherein said first pair of common gate coupled transistors are N-channel devices and said second pair of common gate coupled transistors are P-channel devices.

4. The integrated circuit device of claim 1 wherein said first and second additional transistors are N-channel devices.

5. The integrated circuit device of claim 1 wherein charge is shared between said pairs of first and second complementary bit lines as said integrated circuit device enters a precharge portion of a memory circuit cycle.

6. The integrated circuit device of claim 1 comprising a multi-chip package device.

* * * * *